United States Patent
Vialatte et al.

(10) Patent No.: US 8,650,015 B2
(45) Date of Patent: Feb. 11, 2014

(54) METHOD AND DEVICE FOR ACQUIRING, RECORDING AND PROCESSING DATA CAPTURED IN AN AIRCRAFT

(75) Inventors: Jean-Luc Vialatte, Toulouse (FR); Sophie Calvet, Fonsorbes (FR)

(73) Assignee: Airbus Operations SAS, Toulouse (FR)

( * ) Notice: Subject to any disclaimer, the term of this patent is extended or adjusted under 35 U.S.C. 154(b) by 1038 days.

(21) Appl. No.: 12/663,149

(22) PCT Filed: May 29, 2008

(86) PCT No.: PCT/FR2008/050946
§ 371 (c)(1),
(2), (4) Date: Dec. 4, 2009

(87) PCT Pub. No.: WO2008/152310
PCT Pub. Date: Dec. 18, 2008

(65) Prior Publication Data
US 2010/0185362 A1 Jul. 22, 2010

(30) Foreign Application Priority Data
Jun. 5, 2007 (FR) .................................... 07 04019

(51) Int. Cl.
*G06G 7/48* (2006.01)
*G06F 17/50* (2006.01)
(52) U.S. Cl.
CPC .............................. *G06F 17/5095* (2013.01)
USPC ............... 703/8; 701/32.8; 701/33.4; 369/21; 455/431

(58) Field of Classification Search
CPC .................................................. G06F 17/5095
USPC .......... 386/232, 248, 326, 328, 353; 715/720; 369/21; 455/431; 340/7.4, 945; 701/3–14, 32.3–32.8, 33.4; 703/8
See application file for complete search history.

(56) References Cited

U.S. PATENT DOCUMENTS

| 6,778,537 B1 * | 8/2004 | Ishibashi .................. 370/395.62 |
| 2003/0063131 A1 * | 4/2003 | Ma ................................. 345/838 |
| 2004/0260777 A1 | 12/2004 | Kolb et al. |
| 2005/0258942 A1 | 11/2005 | Manasseh et al. |
| 2005/0267656 A1 | 12/2005 | Dabrowski |
| 2007/0112488 A1 | 5/2007 | Avery et al. |
| 2008/0007651 A1 * | 1/2008 | Bennett ........................ 348/443 |

FOREIGN PATENT DOCUMENTS

FR 2 883 088 9/2006

\* cited by examiner

*Primary Examiner* — Thai Tran
*Assistant Examiner* — Mishawn Dunn
(74) *Attorney, Agent, or Firm* — Oblon, Spivak, McClelland, Maier & Neustadt, L.L.P.

(57) ABSTRACT

A device for acquiring and recording data captured in an aircraft including a plurality of sources of data streams to be recorded, at least one source of dated values of recording parameters, and a recording mechanism recording data from the data streams and parameter values, on at least one non-volatile information medium. The recording mechanism is adapted to store, in separate files, the data of the various streams of data associated with the dated values of recording parameters.

20 Claims, 10 Drawing Sheets

METHOD AND DEVICE FOR ACQUIRING, RECORDING AND PROCESSING DATA CAPTURED IN AN AIRCRAFT

BACKGROUND (1) Field

The present invention relates to a method and a device for acquiring and recording data captured in an aircraft. It relates in particular to the flight test installations for recording and viewing video, audio, graphical data and more generally any type of digital data.

(2) Description of the Related Art

It is known that the task of the flight test installations is to record the video sources, for example SDI (acronym for "Serial Digital Interface", for serial digital interface), especially of test cameras or of videos originating from systems of the airplane, and certain data representing associated airplane parameters. The recording systems are proprietary systems which have necessitated adaptations to the needs of test airplanes. They store the data on magnetic tape cassettes. Depending on the year and on the technology then available on the market, different types of video recording format and of recorders have been used.

FIG. 1 schematically illustrates the functional blocks of a prior art video measuring system. In such a system, the need to time-stamp and associate data of airplane parameters with the video as well as the need to record as many channels as possible, has led to making adaptations to the professional hardware available on the market by avoiding certain functions as much as possible and by making qualitative and quantitative compromises.

As can be seen in FIG. 1, the video is obtained by camera transducers 105 and is then processed by processing means 115. A GMT 110 (acronym for "Greenwich mean time" for Greenwich mean time), or in other words a time stamp based on a universal time, is applied thereto in order to know precisely the progress of the test and to connect the video to all the other data obtained in parallel, especially the airplane parameters 120. For certain airplanes, the airplane parameters are calculated by an on-board calculator (not shown) and coded. The corresponding data are limited in number of parameters and in refresh speed. At the outlet of processing means 115, the signal is, for example, transported according to the SDI standard "SMPTE 259". The speed of such a connection is fixed at 270 Mbps.

The signal is viewed on a view screen 125 during the test itself. It is noted that format converters (not shown) are necessary to view the SDI video signal. Furthermore, the video and the metadata, or in other words the parameters, identifiers of airplane, flight and hardware used, and the time, are recorded on cassettes 130 with a view to being analyzed, archived and/or stored by ground means 135. The recording format used is imposed by the recorder used. This format is intended for professionals only. Moreover, airplane data (type, No. etc.) are added to facilitate classification and archiving. These particulars are included on the cassette. In this way there is obtained a header for each cassette.

On the ground, the cassettes obtained are then analyzed by specialists on a processing bench. Magnetic tapes are processed in linear manner, the cassette having to be gone through to search for the desired sequence. In addition, since the airplane parameters are recorded in partial manner, a connection between the processing bench and a database is necessary.

As is understood upon reading the foregoing, the on-board architecture of the current video IEV (French acronym for "Flight Test Installation") is therefore relatively complex by reason of the media used, or in other words magnetic tapes. The streams (video, audio and airplane parameters) are effectively recorded on cassettes.

This prior art has numerous disadvantages:

- a video tape recorder makes it possible to record only video streams of standard definition, also known as "SD". To be able to record video streams of high definition, also known as "HD", it would be necessary to use video tape recorders of HDCam type, entailing extra cost. To be able to record graphical pages of ASVI type (acronym for "Avionics Serial Video Interface" for avionic serial video interface), relating to the cockpit instruments, or of VGA type (acronym for "Video Graphics Array" for graphic video matrix), it would be necessary to add modules for converting these signals to an SD or HD video signal;
- the time-stamping of images on a video tape recorder takes place on the basis of what is known as a "timecode", furnished by way of an AES signal (acronym for "Audio Engineering Society" for audio engineering society, a standardization organization that defines a digital signal structure for professional audio input). A hardware module making it possible to convert airplane time to AES timecode must therefore be developed specifically so that the images can be time-stamped on the basis of airplane time and
- no system is provided with on a video tape recorder for recording dynamic parameters. A hardware module for encoding the airplane parameters on an audio track must therefore be developed to permit recording of these airplane parameters. Another hardware module must also be developed for reading of these parameters during processing on the ground.
- the cassettes constitute a linear medium. This means that the different streams (audio, video and parameters) must be synchronized during acquisition. This poses a problem, because the times for transmission of these different streams are different.

BRIEF SUMMARY

The objective of the present invention is to remedy all or part of these disadvantages. In particular, the objective of the present invention is to solve all or part of the problems indicated hereinafter.

A first problem is to associate and synchronize the metadata, the video data, the audio data and the time tracks of each stream simply and without limitation. The video streams must be acquired without loss of information, or in other words in native resolution and frequencies, and must be stored in compressed or uncompressed form. In particular, the different streams must be recorded on the same medium, in practice at least one hard disk, but preferably in different files, thus achieving the advantage that it is not necessary to synchronize the streams during acquisition.

A second problem relates to the highly imminent obsolescence of the recording medium used heretofore, the magnetic tape cassette, and of the recording and reading hardware. The problem is to find an exchange format that not only satisfies the constraints of the on-board environment but also is adapted to the constraints encountered on the ground, especially automatic archiving and simple and fast processing of the acquired data. A preferred objective is to establish uniform archiving infrastructures for the video and for the airplane data already recorded on hard disk.

A third problem is to enable recording of all types of formats. In fact, new formats, especially for high definition, are appearing at the output of computers, for example in the form of ARINC 818 (acronym for "Aeronautical Radio, Incorporated", a registered trademark, for aeronautic radio company, whose 818 standard relates to an avionics digital video bus), VGA, data describing the test to be associated, pretrigger functions, or in other words pre-trigger functions, and playback functions ("play" or "replay" in English). In addition, new powerful compression algorithms and hardware allowing high speeds are appearing. The objective of the invention is therefore to determine an on-board system architecture not specific to video as well as a file format for acquiring, compressing, synchronizing, storing and playing back and processing different streams of data, video, audio, parameters and graphs without qualitative and quantitative limitation.

The objective of the present invention is in particular to solve all or part of these problems. To this end, according to a first aspect, the objective of the present invention is a device for acquiring and recording data captured in an aircraft, comprising:

a plurality of sources of data streams to be recorded, at least one source of time-stamped recording parameter values, and means for recording of data originating from data streams and of parameter values on at least one non-volatile information medium, characterized in that the recording means are adapted for storing the data of different data streams in separate files, the data recorded in each file being associated with the said parameter values.

In this way the invention provides an on-board system architecture that is not specific to video as well as a file format making it possible to acquire, compress, synchronize, store and play back and process different streams of data, video, audio, parameters and graphs without qualitative and quantitative limitation.

In addition, the proposed architecture is a modular architecture, the different audio/video streams originating from different sources being acquired by several different processes, thus making it possible to adjust the dimensioning (the number of acquisition servers and of storage hard disks) to the number of channels being recorded, and facilitating the addition of new functions.

By virtue of these arrangements, it is not necessary to synchronize the streams during acquisition.

Recording the streams in several different files has the following advantages:

on board, the files are generated by several different processes and can be recorded on several different hard disks, and on the ground, the storage of different streams in separate files makes it possible to limit the size of the files and the quantity of data to be processed as a function of requests, since only the files containing the requested streams must, for example, be stored "nearline".

The invention proposes a hardware architecture designed around a simple server (which may be a single server), associated with a file format adapted to the constraints of aeronautics and more particularly of flight tests.

The proposed file format makes it possible to record all types of data with the possibility of synchronizing them and facilitating the processing, especially by random access to the data on the basis of an absolute time, by automatic introduction of particulars into a database to facilitate searching and by making the data secure.

In addition, the proposed architecture is a modular architecture, the different audio/video streams originating from different sources being acquired by several different processes, which makes it possible to adjust the dimensioning (the number of acquisition servers and of storage hard disks) to the number of channels recorded, and facilitates the addition of new functions.

The ultimate goal is to obtain optimized "workflows" (on the ground and in flight) taking into account the technical constraints of flight tests. It is recalled here that a "workflow" is a stream of information items within an organization, such as the automatic transmission of documents between persons. "Workflow" (in French literally "stream of work") is the term used for computerized modeling and management of all of the tasks to be accomplished and of the different actors involved in achievement of a technical process (also known as operational process or else enterprise procedure). The term "workflow" could therefore be translated into French as "electronic management of technical processes." In a more practical sense, "workflow" describes the validation cycle, the tasks to be accomplished between the different actors of a process, the time limits and the validation conditions, and it provides each of the actors with the information items necessary for completion of their tasks. In general, it is makes it possible to track and identify the actors by defining their role and the manner in which they best perform it. The "workflow" engine is the software device making it possible to execute one or more definitions of "workflow". As a result of linguistic misuse, this software device can be referred to quite simply as "workflow".

Management of contents (data, video, audio, graphics) in a cassette-free computerized environment makes it possible to:

limit the costs, and facilitate processing (streamlining of data archiving, easy and fast access to data).

This solution is supported by a simple architecture around a central server, but which can also be adapted in terms of both input formats and compression ratios.

According to particular characteristics, the recording means are provided with a means for generating synthesis files generated in step with the recording of files representative of data originating from different data sources, the synthesis file making it possible to reference and read these files synchronously and containing external references, each pointing to the files representative of data originating from data sources. This synthesis file permits synchronous reading of files by associating several time-stamped streams contained in several files.

According to particular characteristics, the recording means are capable of recording the parameter values dynamically, in at least one file.

According to particular characteristics, the recording means are capable of recording parameter descriptors as well as data relating to the test by virtue of a universal data structure.

For example, the data relating to the test are the type of test, the test number, the airplane type, the airplane number and the flight number.

According to particular characteristics, the recording means are capable of recording each datum of data streams in association with the universal time at which it was acquired.

In this way it is possible to record all types of data with the possibility of synchronizing them, thus facilitating processing, especially by random access to the data on the basis of a universal time.

By virtue of each of these arrangements, the memory space necessary for data storage is limited.

According to particular characteristics, the device constituting the object of the present invention as explained briefly hereinabove is provided with a reading means capable of generating a synthesis file for at least one transmission of recorded data originating from data streams, the synthesis file making it possible synchronously to reference and read the files containing the data to be transmitted and containing external references, each pointing to files representative of data to be transmitted.

This synthesis file indicates which streams must be transmitted. This mechanism makes it possible to record and process the streams in different files.

According to particular characteristics, the device constituting the object of the present invention as explained briefly hereinabove is provided with a means for routing data originating from sources toward recording means, the recording means being provided with a time-stamping means capable of compensating for the transmission delays induced by the routing means.

In this way the time-stamping is very precise.

According to particular characteristics, the recording means are capable of formatting the data originating from data sources in the form of files in MXF format (acronym for "Material eXchange Format" for material exchange format).

As regards the advantages of the MXF format relative to its logical structure, it can be pointed out that of the logical structure of files in MXF format, which is independent of the physical structure thereof. Thus it is possible to organize and synchronize the different streams and the metadata between them regardless of their types and their locations.

This format offers mechanisms that meet the constraints of the flight test installation, especially:
 management of the file mode and of different streaming modes,
 support for external references,
 synchronization of an arbitrary number of streams of different types,
 a generic mechanism for random access
 highly advanced metadata management: management of static and dynamic metadata, management of the scope of metadata, standardized metadata "frameworks" covering broad needs, possibility of defining proprietary metadata "frameworks".

According to particular characteristics, the data streams are time-stamped at the moment of acquisition by using an internal clock synchronized with the aircraft clock. For example, the internal clock can be set by an external NTP server or by a GMT/AES timecode converter from an AES timecode input. The image associated with this time code can then be located from index tables. This mechanism makes it possible to assure synchronous reading of the recorded data streams, even when they are not using the same time base.

According to particular characteristics, the recording means are provided with means for wrapping each data stream originating from a data-stream source in a file that contains static metadata identifying an aircraft, a flight test and the said data source, the data of the data stream and information items representative of the instant of capture of the said data.

According to particular characteristics, the device constituting the object of the present invention as explained briefly hereinabove is provided with a buffer memory in which, when recording is not activated, the data streams are stored and preserved for a predetermined duration and, when recording is started, at least part of the data stored temporarily in memory is recorded.

According to particular characteristics, the data streams originating from data-stream sources are divided into time segments of fixed duration, the recording means recording, for each time segment and each parameter, the most recent value of the parameter available during this time segment.

The time segments generated in this way are wrapped as needed in a file containing static metadata describing the airplane and the test as well as the different acquired parameters and the dynamic metadata, in which there are recorded the values and the time stamps of acquisition of the parameters used for each time segment.

In this way it is possible to reorganize the parameters in time in such a way that they can be stored and processed in the same way as an audio/video stream.

According to particular characteristics, the recording means are capable of recording descriptive metadata files containing parameter values distributed in segments of fixed duration as a function of the time stamp of acquisition thereof, a single parameter value being recorded per parameter and per segment.

According to particular characteristics, the recording means are capable of dividing the recordings into continuous interruption-free and homogeneous sequences without changing configuration, a new directory provided with new files for each new sequence being generated whenever the recording is restarted or reconfigured.

According to particular characteristics, the recording means are capable of storing the same data with several different compression ratios and algorithms.

According to particular characteristics, in the device constituting the object of the present invention as explained briefly hereinabove, the recording means are capable, during a flight test, of storing the data in "streaming acquisition" mode, a recording mode in which the file is divided into several partitions containing the data of at least one data stream followed by an information block that makes it possible to read the said data of a data stream.

This recording mode is used when the files are acquired on a linear medium (tape) or when there is a risk that acquisition will be suddenly interrupted. Only the streams situated after the last readable block of information items cannot be easily decoded. In this way, the files are acquired on board in "streaming acquisition" mode, so that they can be used even if they were not closed correctly. They are divided into several partitions corresponding to a predetermined duration. Thus, in the case of a crash, only the stream situated in the last partition cannot be easily decoded.

According to particular characteristics, the recording means are capable on the ground of converting the recorded data to record them in "file" mode, in which the file is divided into a plurality of blocks, a file header and/or a file footer containing information permitting the file to be read, and a file body containing the data originating from data streams.

This recording mode is more adapted to files stored on a medium that permits random access (hard disk or compact disk).

According to particular characteristics, the device constituting the object of the present invention as explained briefly hereinabove is provided with indexing means capable of generating an index table that indicates where the different recorded images are located.

This table therefore permits random access to an image for a stream and a given instant.

According to particular characteristics, the recording means are capable of preserving at least one data stream in its raw form, without compression.

According to particular characteristics, the recording means are capable of defining descriptive metadata, making it possible to embellish each file with information items intended for the user, organized in "framework" form.

According to particular characteristics, the recording means are capable of recording static descriptive metadata files provided with lists of sets of metadata describing parameter values.

According to particular characteristics, the recording means are capable of furnishing recorded data in the form of playback of one or more synchronized data streams.

According to a second aspect, the objective of the present invention is a method for acquiring and recording data captured in an aircraft provided with a plurality of sources of data streams to be recorded, at least one source of time-stamped recording parameter values, and means for recording data originating from data streams and from parameter values on at least one non-volatile information medium, characterized in that it is provided with:
a recording step for storing data of different data streams in separate files, and
a step of associating recorded data in each file with the said parameter values.

BRIEF DESCRIPTION OF THE DRAWINGS

Other advantages, objectives and characteristics of the present invention will become apparent from the description hereinafter, written by way of explanation but in no way limitation with reference to the attached drawings, wherein.

DETAILED DESCRIPTION

Throughout the description, the term "disk" covers both hard disks and compact disks.

Figure 1:
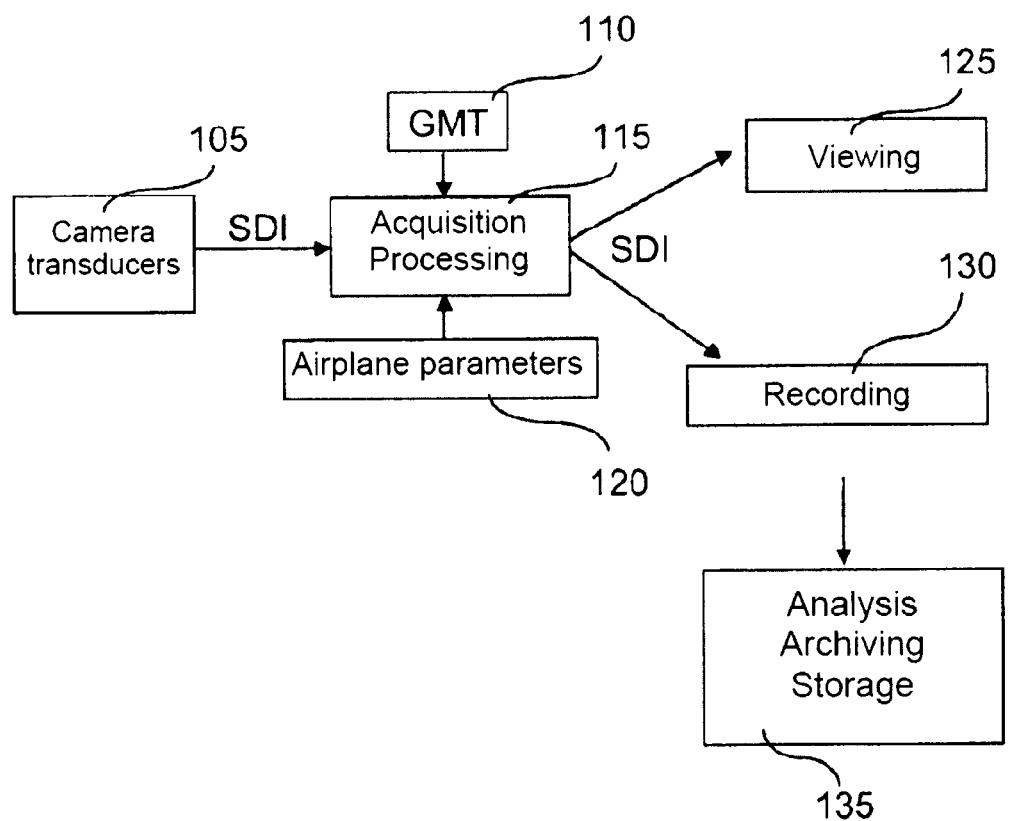
FIG. 1 shows, in the form of a functional diagram, a prior art system.
Figure 2:
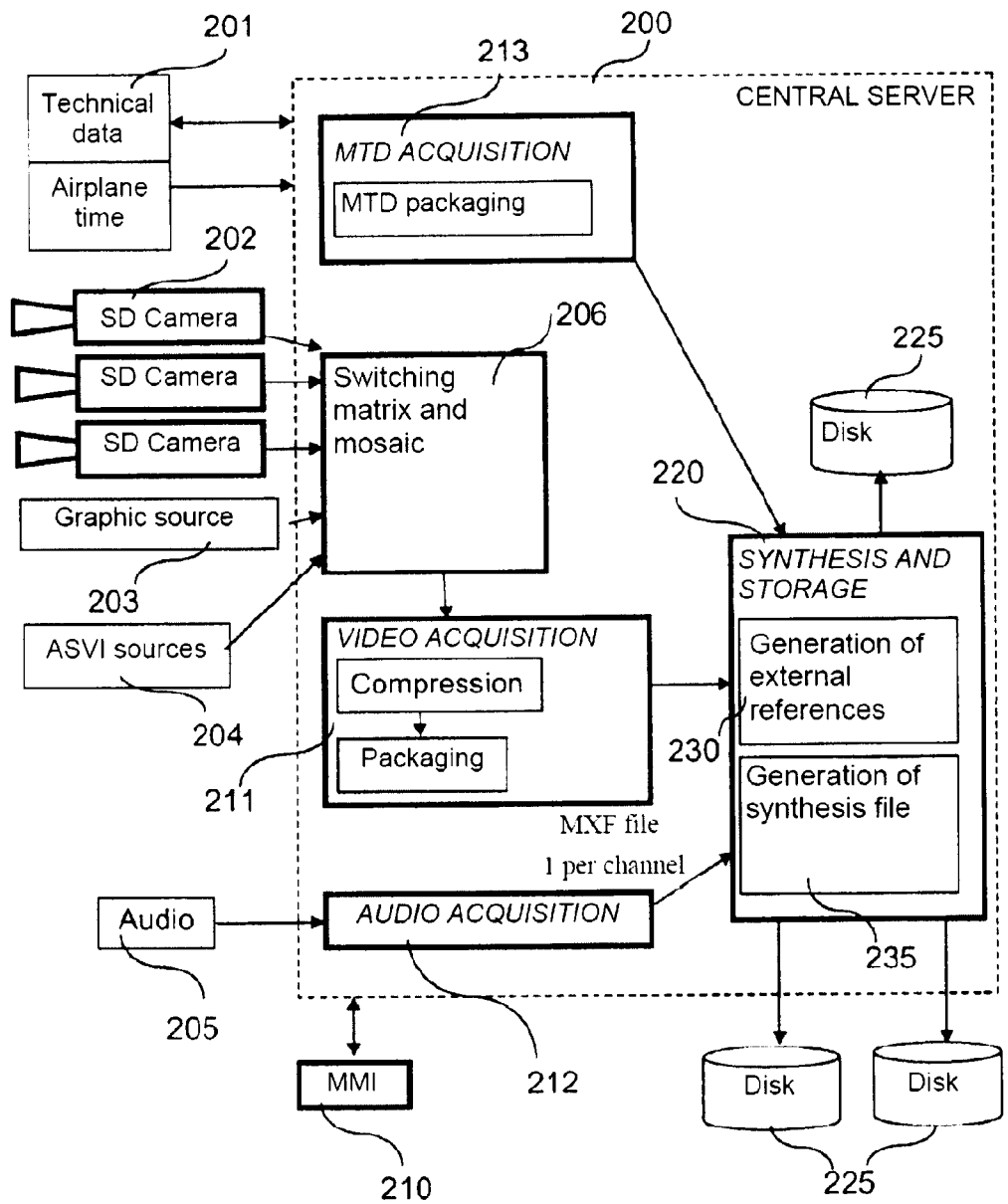
FIG. 2 shows, in the form of a logic diagram, a particular embodiment of the device constituting the object of the present invention, FIG. 3 schematically shows an organization of recorded files in a preferred embodiment of the method and of the device constituting objects of the present invention, FIGS. 4, 5 and 6 schematically show recorded file structures according to three different recording modes, FIG. 7 schematically shows a file structure employed in a particular embodiment of the method and of the device constituting objects of the present invention, FIG. 8 schematically shows a "framework" employed in a particular embodiment of the method and of the device constituting objects of the present invention, FIGS. 9 to 14 schematically show file structures employed in particular embodiments of the method and of the device constituting objects of the present invention.

As illustrated in FIG. 2, from a logical viewpoint, the architecture of a particular embodiment of the device constituting the object of the present invention, based on a central server 200, is divided into four levels. On the left of FIG. 2 there are shown the interface sources giving the possibility of acquiring data from any type of source. In FIG. 2 the inputs are obtained from technical data and airplane time 201, from cameras 202, from a graphic source 203, from an ASVI source 204 and from an audio source 205.

FIG. 2 then shows systems for routing the sources to acquisition servers via a switching matrix 206 provided if necessary with a mosaic generator system used to assemble several SD sources into an HD image, in order to form an image mosaic with which the number of recorded channels can be reduced. At the center of FIG. 2 there are shown the systems for acquiring audio/video streams and airplane parameters. Their task is to retrieve the signals sent by the different sources and to convert them to the form of files in MXF format (acronym for "Material eXchange Format" for material exchange format). These different acquisition systems may function independently of one another (they do not have to be synchronized). In FIG. 2, this part is provided not only with a man-machine interface 210 but also with a video acquisition module 211, an audio acquisition module 212 and a metadata (technical data and airplane time) acquisition module 213, also denoted "MTD" in the figures.

Finally, FIG. 2 shows the synthesis, storage and reading system 220, which has the task of retrieving the different files in MXF format, storing them on disks 225 and reading them. The different files can be written independently of one another (they do not have to be synchronized). A synthesis file is generated and recorded as needed in order to permit synchronous reading of the files. To this end, storage system 220 is provided with a module 230 for generation of external references incorporated in the synthesis file by a module 235 for generation of the synthesis file.

According to the present invention, a standardized MXF file format is preferably employed by choosing those functionalities offered by this format that are appropriate for the needs of flight test installations. The MXF format is a format that is standardized and independent (therefore permanent and interoperable), open and capable of evolving (therefore capable of generating numerous different video formats and codecs), and it is being increasingly adopted. It may be used as an exchange format over the entire production sequence, from acquisition to transmission, while passing through post-production, indexing and archiving.

The MXF format is capable of evolving. New standards and recommendations are being written to respond to new problems. Thus, the "422M" standard has recently been added to describe the "Jpeg2k" container. The "RP 2008" recommendation completes the "381M" standard for the "H.264". Standards are being written for the "VC-1" and the "VC-3".

The MXF format offers all the mechanisms that satisfy the constraints of the flight test installation, especially:
management of the file mode and of different streaming modes,
support for external references,
synchronization of an arbitrary number of streams of different types,
a generic mechanism, for random access and
highly advanced metadata management: management of static and dynamic metadata, management of the scope of metadata, standardized metadata "frameworks" covering broad needs, possibility of defining proprietary metadata "frameworks".

In fact, an important point of the invention is the use and definition of a proprietary metadata "framework" adapted to flight test installation and aeronautical needs for more general uses.

It is recalled here that a "framework" is an assembly of libraries permitting the rapid development of applications. It furnishes sufficient software bricks to enable production of a finished application. These components are organized to be used in interaction with one another, particularly according to what are known as "urbanization" techniques.

Some attempts have been made to create a French equivalent of this term. For example, the terms "cadre d'applications" [applications frame], proposed by the Quebec Office of the French Language, or "cadriciel" [having the nature of a frame] are sometimes encountered.

A "framework" furnishes a set of functions that facilitate the creation of all or part of a software system as well as an architectural guide by partitioning the target domain into modules. A "framework" is usually implemented with the aid of an object language, although that is not strictly necessary: in this way an object "framework" furnishes an architectural guide by partitioning the target domain into classes and by defining the responsibilities of each as well as the collaborations between classes. A subassembly of these classes may be abstract classes.

Although the use of the term software library is limited to the library proper, the term "framework" may be employed by extension to include also the software architecture recommended for this library (organized into layers) and even the development environment built around it, even if this is capable of managing different "frameworks".

Different types of "frameworks" exist:
system infrastructure "framework": for developing operating systems, graphical interfaces, communication tools;
middleware integration "framework": for federating heterogeneous applications. For making different technologies available in the form of a single interface;
enterprise "frameworks": for developing applications specific to the activity sector of the enterprise and
content management system oriented frameworks.

The main advantages of these "frameworks" are the reuse of their code, the standardization of the software life cycle (specification, development maintenance, evolution); they make it possible to formalize an architecture adapted to the needs of the enterprise. They depend partly on the experience of previous developments. These "frameworks" are, as it were, software packages that are extremely flexible and capable of evolving.

Another important aspect is the diversity of sources envisioned:
SD sources: PAL and NTSC resolutions,
HD sources: 1920×1080 resolutions, 50 images per second, and other,
ASVI (acronym for "Avionic serial video interface" for avionic serial video interface) or "Arinc818" sources: 1024×768 resolutions, 60p, or in other words 60 images per second in progressive mode,
VGA, SVGA (acronym for "super video graphics array" for super video graphic matrix) and XGA sources (acronym for "extended graphics array" for extended graphic matrix): 640×480 to 1280×1024 resolutions, 60p,
analog or digital audio sources,
airplane parameter data source: approximately 50 parameters, frequency such as five acquisitions per second, with the possibility of acquiring much more and any type of data, and
other types of sources.

It is noted that the different sources are not synchronous.

Optionally, the switching matrix makes it possible to group the connections in the same location and to select the desired cameras to be recorded (generally there are more cameras than available recording channels). It is noted that a single SD/HD-SDI switching matrix is necessary. It manages synchronous sources and is driven by the control MMI, which is, for example, a menu displayed on the video view screen.

The mosaic generators make it possible to group several cameras on the same recording channel with the aid of a mosaic. It is possible, for example, to group several SD cameras on a single HD channel without notable loss of quality.

The acquisition of audio/video streams groups several steps together:
actual acquisition of streams,
compression of these streams,
time-stamping of these streams and
wrapping of compressed and time-stamped streams into files of MXF format.

Compression is applied according to one of the codecs (combination of the terms "coder" and "decoder) adopted. A first compression in high quality is applied in real time by the acquisition server, in order to limit the speed of transfer of streams to the storage module. A second compression in proxy quality is applied simultaneously if possible, in order to avoid a step of proxy generation on the ground. Several codecs may be used within the same server, depending on the sources and the sought quality.

Different streams are precisely temporally coded or "time-coded," or in other words time-stamped as a function of the moment at which they were acquired, with a precision on the order of the duration of one image. Several methods are envisioned:
a GMT/AES timecode converter is placed upstream from the recording means. These recording means are equipped with an AES timecode input for time-stamping the images acquired as a function of the AES timecode. This method can be adapted directly, because time-stamping on the basis of an AES timecode is available over all commercial video acquisition servers. It is based exclusively on the hardware and is therefore more precise. On the other hand, it necessitates the development of a GMT/AES timecode converter of hardware type, and it is not robust to breakdowns (time-stamping becomes impossible in the case of breakdown of the converter or of AES signal transmission problems).
a method based on the internal clock of the servers: the internal clock of the acquisition servers can be synchronized to the airplane clock by using the same mechanisms as in the airplane parameter acquisition racks or by using the NTP server (acronym for "Network Time Protocol" for network time-stamping protocol) of the on-board calculator. For example, the internal clock can be set by an external NTP server or by a GMT/AES timecode converter on the basis of an AES timecode input.

By virtue of these time data, the recording means are capable of furnishing recorded data in the form of playback of one or more synchronized data streams.

The commercial acquisition cards use their own clock to time-stamp the acquired images. An acquisition software module must therefore be developed to permit establishing a correspondence between the clock of the acquisition cards and the internal clock of the servers and in this way time-stamping of the video as a function of the internal clock of the servers. This method therefore necessitates a small adaptation of the acquisition software, but on the other hand it does not need specific hardware. It is more robust to breakdowns (the internal clock of the servers and continues to be usable and sufficiently precise for several days in case of loss of synchronization).

The time-stamping method takes into account the transmission delays induced by the routing system between the acquisition devices (camera, microphone, other, etc.) and the acquisition servers. This delay is actually zero in the case of direct transmission, but it can amount to an offset of several images when it is carried out by way of a mosaic generator. Since this delay is known, it is compensated for by the device according to known techniques.

Each stream is wrapped as needed into a file of atomic MXF format. This file contains the static metadata describing the airplane, the test and the data source, an audio or video track containing the acquired stream, and a dynamic temporal code or "timecode" track containing the time-stamps of each image. This file follows the structure adopted for the on-board files, detailed with respect to FIG. 7.

As a variant, a pre-recording function can be integrated into the servers: when recording is not activated, the compressed and time-stamped streams are stored in a temporary space, preferably random-access memory, and preserved for a certain time. When recording is started, they are integrated into the file in the generated MXF format.

The acquisition of airplane parameters groups several steps together:
  establishment of the connection to the data-emitting system,
  acquisition of parameters (acquisition values and time stamps) furnished by the data-emitting system,
  sorting of these parameters as a function of their acquisition time stamp, and
  wrapping in a file of MXF format.

The first two steps correspond to the implementation of a client on the standard data-emitting system. They make it possible to subscribe to a parameter list, to retrieve general information items about these parameters (names, units), then to retrieve, at regular time intervals, all the industrial values, or in other words the directly processable values measured for these parameters, together with their acquisition time stamps.

The third step is specific to the video flight test installation. It makes it possible to reorganize the parameters in time in such a way that they can be stored and processed in the same way as an audio/video stream. In fact, an audio/video stream is divided into segments of fixed duration, which duration corresponds in general to the period or frequency of the image frames, or "framerate," such as 40 ms for a video at 25 images/second. The parameter acquisition software divides the time into segments of fixed duration (corresponding to the frequency desired for the parameters) and, for each segment and each parameter, preserves the most recent parameter value acquired during this time segment (or the last available value if no value was acquired during this time segment).

The time segments generated in this way are wrapped on the fly into a file of atomic MXF format. This file contains the static metadata describing the airplane and the test, as well as the different acquired parameters. It also contains a dynamic metadata track divided into segments of fixed duration, in which there are recorded the acquisition values and time-stamps of the parameters adopted for each time segment. This file follows the structure adopted for the on-board files, which structure is detailed with respect to FIG. 7.

As for the audio/video streams, a pre-recording function is integrated into the acquisition software.

As regards storage and management of sequences, the files of MXF format originating from different acquisitions are recorded on at least one storage disk. Each file is recorded on a single disk, in step with generation thereof.

Preferably each disk records a copy of all files. However, if the cumulative speed of the different files is too great compared with the speed supported by a single disk, the speeds are distributed over several disks, by recording certain files on one disk, certain files on other disks, employing as many disks as necessary.

The following table presents examples of necessary file speeds and volumes:

|  | Speed (Mb/s) | Speed (MB/s) | 4 h space (GB) | 6 h space (GB) |
|---|---|---|---|---|
| 1 SD camera | 10 | 1.3 | 18 | 27 |
| 1 HD camera | 40 | 5 | 72 | 108 |
| 1 SD proxy | 1 | 0.1 | 1.8 | 2.7 |
| 6 SD configuration | 70 | 8.8 | 126 | 189 |
| 4 SD + 2 HD configuration | 130 | 16 | 234 | 351 |

A software routine scans the files originating from the different acquisitions and generates a synthesis file of MXF format, making it possible to reference and read these files synchronously. This file contains external references, each pointing to files acquired elsewhere. It contains the static metadata describing the airplane and the test, as well as a copy of the static metadata specific to each file (camera identifier, parameter description). Since this file is small but critical, it is rewritten in its entirely at regular intervals, preferably at two different locations on two different disks. In this way a correct file is always available in the case of deterioration of the second storage system.

To facilitate transfer to the ground, the acquired files are preferably recorded simultaneously in the same directory (or in directories having the same name when the files are distributed over several disks).

Figure 3:
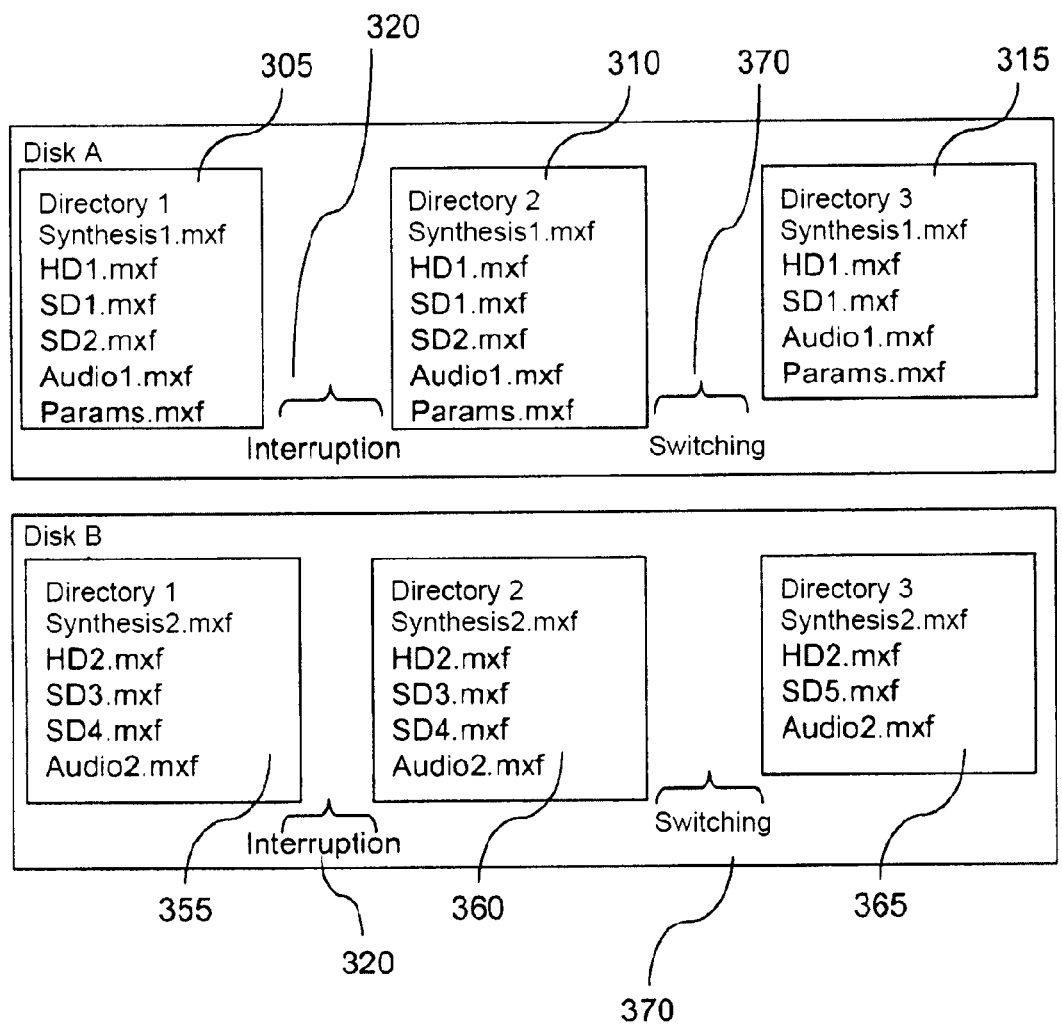

Recording can be stopped, restarted or reconfigured during a flight test. To facilitate processing, the recordings are preferably subdivided as illustrated in FIG. 3 into sequences 305, 310, 315, 355, 360 and 365 that are continuous, or in other words without interruption, and homogeneous, or in other words without change of configuration. In this way there is created a new directory with new files for each new sequence, whenever recording is restarted after an interruption 320, or reconfigured, regardless of the reason (switch of camera, change of disk, restart after a crash), in the present case following a switching 370.

As regards the man-machine interface ("MMI"), the user is able, by virtue thereof, to modify the sources that he wishes to record. Two solutions are envisioned for achieving switching of sources without being inconvenienced by the fact that they are not synchronous:
  in a first variant, all the SDI sources are synchronized to avoid image loss: this solution implies the installation of synchronization hardware or of a switching matrix equipped with "reclocking" functions,
  in a second variant, recording is stopped before the switching and is restarted after the switching. This implies the loss of some images over the switched channel, but does not necessitate adaptation of the hardware. Recording is stopped and restarted automatically by the video server in a manner that is transparent for the user.

In order to limit the impacts of "crashes" and breakdowns, provisions are made for:
  generation of files in MXF format in "streaming" mode, or in other words continuously, thus making it possible to limit data losses in the case of crash,
  functions of resumption after errors: the acquisitions are restarted automatically in case of error,
  diagnostic functions that verify the state of the video flight test installation before a test,
  functions of detection of breakdown during a test (loss of signal, loss or freezing of an image, problems with an acquisition, time-stamping or storage system), which trip an alarm and stop acquisition of affected channels, as the case may be.

As regards the chosen file format, the files used in connection with the video flight test installation make it possible to store several types of video and audio streams: SD video (PAL and NTSC format), HD video (formats of 720p and 1080i type), video originating from computers (formats of VGA type), video originating from the cockpit (ASVI formats), audio and other data originating from future needs.

These streams are compressed in order to limit the speeds necessary for transfer thereof and the volumes necessary for storage thereof. Several different codecs are used, to obtain a good compromise between image quality and file size. This compromise may vary as a function of the mode of processing of the files, and it is sometimes necessary to store the same video with several different compression ratios: slightly compressed (high-quality video for bench processing) and/or highly compressed (proxy for processing on individual workstation).

The files make it possible to document these audio/video streams of standard metadata (rights, title, participants, etc.). The files also make it possible to store technical metadata applicable to all streams (description of the airplane and of the flight, etc.) or to only certain streams (camera description, etc.). These metadata are easily modified and indexed in a database.

Finally, these files are also used to record parameter streams (airplane parameters), which are stored in the form of dynamic metadata.

The different audio/video streams originating from different sources are acquired by several different processes (or even several different machines). It is difficult to synchronize these processes and to group the different acquired streams in a single file. The different streams are therefore preferably acquired asynchronously and in separate files (at least one file per process). Each of the streams is then time-stamped precisely, so that they can be subsequently synchronized.

As indicated hereinabove, since the disk speeds used in the on-board architecture are sometimes insufficient to support the cumulative speed of the different streams, the speeds are distributed over several disks as the case may be.

The acquisition processes may be stopped suddenly for multiple reasons (power-supply cut, disk full, hardware or software problem, etc.). In this case, the files can be processed even if they were not closed correctly. The files are therefore acquired in streaming mode, or in other words by regularly writing the vital information items that make it possible to read the file.

Finally, it is possible to change the number and sources of streams (change of video source). These changes are "tracked" via metadata in the files. The files are verified and may be reformatted during transfer to the ground. File verification and manipulation functions are provided for this purpose.

An important advantage of employment of the present invention, and one that did not exist in the prior art, is that the streams can be processed individually by way of the network. Preferably there is one single stream per file, so as not to overload the network.

The streams may also be processed collectively (on a processing bench), as in the prior art. The chosen file format makes it possible to associate, reference and synchronize several time-stamped streams contained in several files, in such a way that these different streams can be synchronously read in full.

Regardless of the mode of processing, the user desires to be able to move through the videos rapidly and to access the recording at a precise instant rapidly. The adopted file permits random access to the images.

In addition, the videos originating from tests constitute a sensitive datum. The adopted file format makes it possible to assure confidentiality of the data. The file format may be for example:
processed in "streaming" mode: the file is then transmitted to the user via the network, the user being unable to copy it, and
encrypted so that it is not readable.

The user may also wish to extract part of a video, to overlay data therein and to export it for an external use, after authorization. The adopted file type supports the mechanisms of "partial restore", extraction of certain streams over a given time interval, overlaying of text and decompression/recompression.

As regards the codecs, the architecture described hereinabove permits the use of different codecs simultaneously, such as "Mpeg4 AVC (H.264)", "VC-1", "Jpeg2k" and "Mpeg2" as well as "Dirac" and "H.265" codecs.

Figure 4:
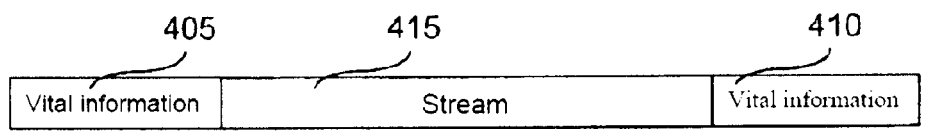
Figure 5:
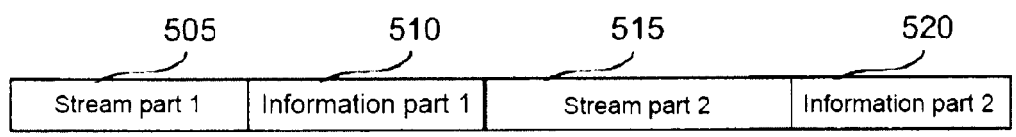
Figure 6:
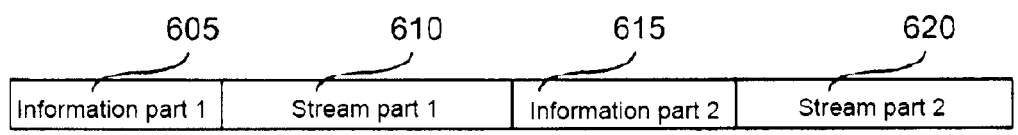

As regards the mode of recording, the MXF file format makes it possible to store the streams in several different modes:
in "file" mode, in which the file is divided into two or three blocks, as illustrated in FIG. 4. File header 405 ("header" in English) and/or file footer 410 ("footer" in English) contain the information items that make it possible to read the file. Body 415 of the file contains the streams. This mode is used when the files are stored on a medium that permits random access (disk or CD);
in "streaming acquisition" mode (continuous acquisition in French), in which the file is divided into several partitions, as illustrated in FIG. 5. Each partition contains acquired streams 505 and 515, followed by information blocks 510 and 520 that make it possible to read these streams. This mode is used when the files are acquired on a linear medium (tape) or when there is a risk that acquisition may be interrupted suddenly. Only the streams located after the last readable information block cannot be easily decoded;
in "streaming read" mode, in which the file is divided into several partitions, as illustrated in FIG. 6. Each partition contains acquired streams 610 and 620, preceded by information blocks 605 and 615 that make it possible to read these streams. This mode is used when the files must be read from a linear medium (tape) or when they must be transmitted over a network, by cable or by wireless means. Only the streams preceding the first readable information block cannot be decoded.

In the uses of the present invention, the "streaming acquisition" and file modes are employed on board and on the ground respectively.

As regards the synchronization mechanisms: the format of MXF files furnishes synchronization mechanisms that make it possible to synchronize an arbitrary number of streams regardless of their types and of their distributions in the file(s).

As regards the external references, the MXF format makes it possible to store the different streams that may constitute an audio/video sequence in different files, known as "atomic" files, and to construct a file known as "synthesis file", which references the files containing the streams that must be read. Each stream is stored in a separate file. One synthesis file is constructed for each transmission. It indicates which streams must be transmitted. This mechanism makes it possible to record and process the streams in different files.

As regards metadata management, the MXF format makes it possible to manage standard metadata (title, holder of rights) and more specific or "proprietary" metadata (description of the airplane and of the test). In addition, the files used during application of the present invention in flight tests contain metadata that are applicable to only a single stream (description of a source). Finally, the MXF format makes it possible to define dynamic metadata for storing the airplane parameters.

Among the advantages of the MXF format relative to its physical structure, the following may be cited:

it makes it possible to employ an index table, which indicates the location of the different images recorded in the different streams. Thus it enables random access to an image for a stream and a given instant, it makes it possible to employ an essence container, which contains the streams in their raw form: audio and/or video stream, dynamic elements (discontinuous timecodes and/or dynamic metadata). These streams are generally chopped into fragments that correspond to a fixed duration, the duration of an image or of a GOP (acronym for "group of pictures" for images group), and the term "frame wrapping" then is used. The streams may also be wrapped by a block (which corresponds to the overall duration of the sequence), and the term "clip wrapping" then is used.

As regards the advantages of the MXF format relative its logical structure, there may be cited that of the logical structure of files in MXF format, which is independent of their physical structure. It is therefore possible to organize and synchronize the different streams and the metadata between them regardless of their types and their locations.

As regards metadata management, the files in MXF format use a single metadata model, thus making it possible to define structural metadata and descriptive metadata at the same time. The structural metadata group the vital information items with which the logical file structure can be described, as well as certain information items with which traces of its creation and of its modifications can be retained. They are mandatory and standardized. The descriptive metadata make it possible to embellish the file with information items intended for the user. They are optional. They are organized in "framework" form.

Three metadata "frameworks" have already been standardized under the name "DMS-1", to meet audiovisual needs. It is also possible to define and use proprietary metadata "frameworks" (the term "Dark Metadata" then is used). Certain software programs employing the MXF format make it possible to view the contents of the DMS-1 "frameworks" and to import and export them in the form of files in XML format (acronym for "extensible markup language" for extended marking language). On the other hand, they ignore the proprietary "frameworks", albeit without suppressing them.

As regards the time-stamping and synchronization mechanisms, the MXF format permits time-stamping and synchronization of different streams. Each track (audio/video stream or dynamic metadata) has its own time base ("framerate") and origin. Readers of files in MXF format permit random access to the data on the basis of an absolute time via the following mechanism: for each track, the absolute time is converted to timecode as a function of the time base of the track. The index tables then make it possible to find the image associated with this timecode, even in a GOP structure. This mechanism makes it possible to ensure synchronous reading of tracks, even if they do not use the same time base.

The files in MXF format make it possible to manage certain more specific functionalities, especially:

"partial restore": this relates to mechanisms that make it possible, on the basis of a file in MXF format, to extract streams and metadata over a given time interval and to record them in the form of raw files or in another file in MXF format, and "AES encryption": the essences in the files in MXF format can be encrypted using the AES algorithm.

To avoid interoperability problems, it is preferable to produce files that have a simple and expanded structure, for example of the "Op1a" type, and that fully satisfy the standard (tools such as the software employing the MXF format, named "analyser" or "analyzer" of the IRT (acronym for "Institut für Rundfunktechnik" [Radio Engineering Institute], registered trademarks), which tools make it possible to detect incompatibilities of files with the standard).

To employ the present invention, it is preferable to record the streams in several different files, thus achieving the following advantages:

on board, the files are generated by several different processes and can be recorded on several different disks, and on the ground, the storage of different streams in separate files makes it possible to limit the file sizes and the quantity of data to be processed as a function of requests; only the files containing the requested streams, for example, must be stored nearline. It is recalled here that "nearline" describes a fast access system that makes data archived on a sequential-access medium rapidly available, as on a random-access data medium.

Figure 7:
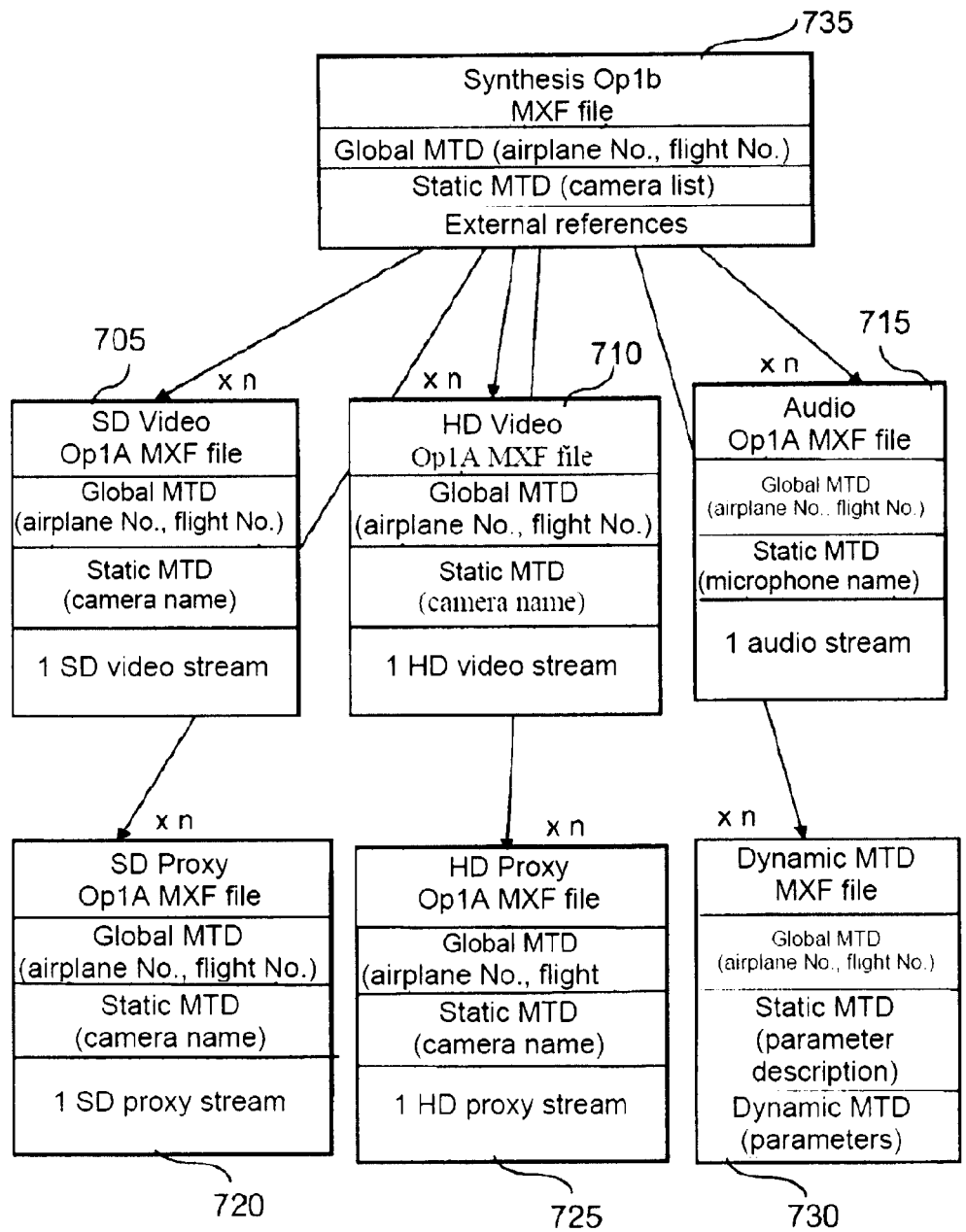

In one embodiment there are employed atomization of streams and use of the file structure illustrated in FIG. 7.

As seen with regard to FIG. 7, two types of files are used:

atomic files 705 to 730, each of which contains a single stream (high-quality video, proxy video, audio or dynamic metadata) and the static metadata containing particulars about the test (airplane and flight identifier) and the stream (camera or microphone identifier, or parameter description). Atomic files 705 to 730 can be processed individually and synthesis file 735, which references the different files 705 to 730 containing the streams. Synthesis file 735 by itself makes it possible to obtain all the information items about the flight test and the different streams: synthesis file 735 contains the static metadata with particulars of the test (airplane and flight identifier) and the static metadata with particulars of each of the sources (camera or microphone identifier, or parameter description, etc.). Synthesis file 735 also makes it possible to process these different streams synchronously.

As regards the "metadata frameworks", the different files in MXF format contain static descriptive metadata (rights, airplane identifier, etc.) and sometimes dynamic descriptive metadata (airplane parameters) satisfying the airplane need, or in other words the need to associate certain measured parameters such as the velocity or the pressure, depending on the type of test being carried out on the airplane.

It is noted that a standardized "framework" of "DMS-1" type can be used for the standard static metadata that are not confidential. These metadata can actually be viewed in certain software programs employing the MXF format. For example, a "production framework" is used to indicate the holder of the rights and the contact information of such holder.

It is also possible to use a DMS-1 "framework" indirectly to store static technical metadata (identifier of the airplane, flight, camera and microphones, parameter description). It is possible, for example, to use a "scene framework" to identify the airplane and the cameras and in this way to make it possible to view them in most of the software programs employing the MXF format.

In preferred embodiments, a proprietary "framework" is used for these static technical data, because it makes it possible to give them exactly the desired name and type and in this way to facilitate viewing, editing and indexing them.

In addition, this proprietary "framework" is adapted to the storage of airplane parameter data, because it makes it possible to greatly limit the number of bytes necessary to store these parameters (approximately 16 bytes per parameter instead of several hundred with an indirect DMS-1 "framework").

The use of a proprietary "framework" also makes it possible to ensure a certain confidentiality. The metadata that it contains are actually ignored by the software programs employing the commercial MXF format. Only a software program modified or configured with the aid of a plan describing the proprietary "framework" is able to interpret them.

Figure 8:
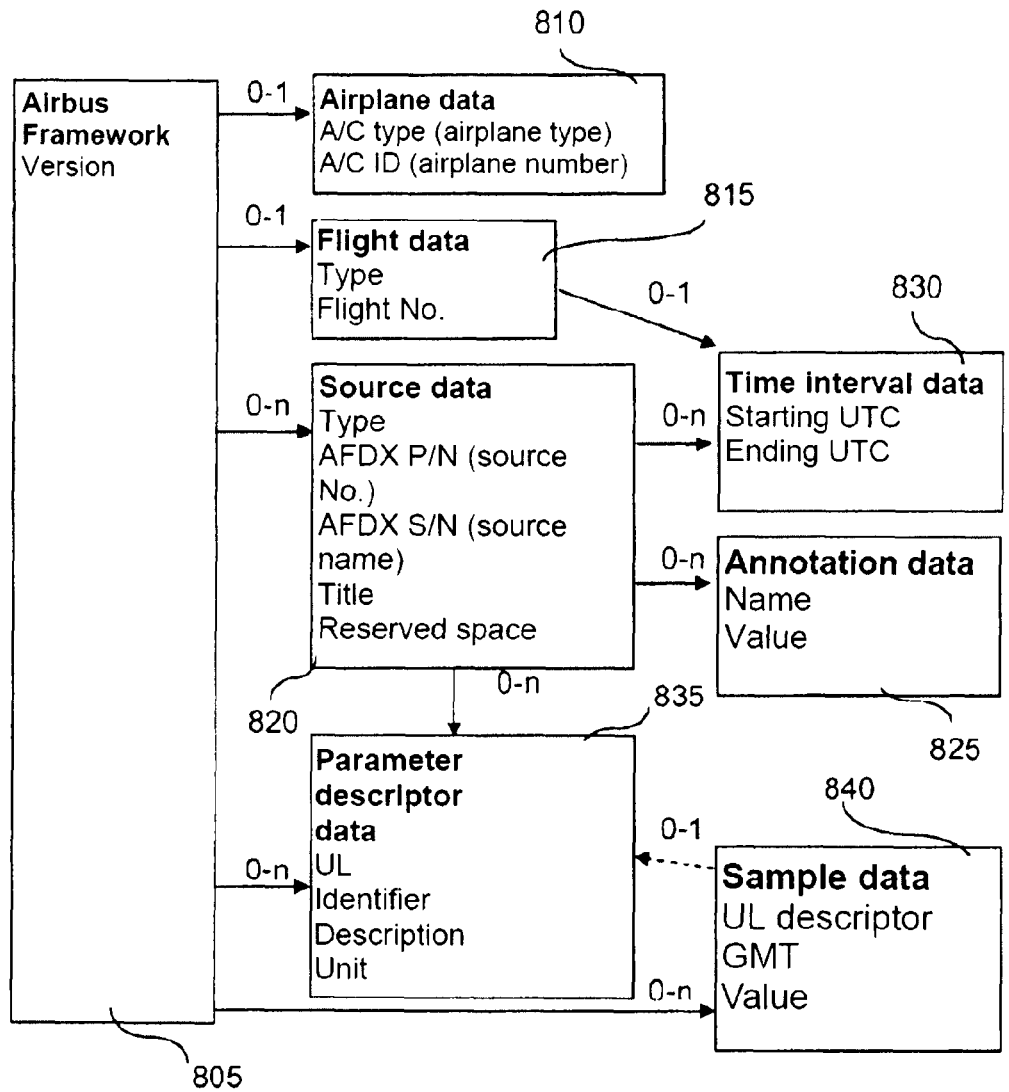

In some embodiments there is employed a "framework" having the structure illustrated in FIG. 8. Such a "framework" 805 makes it possible to store static metadata:
- airplane type and identifier of the airplane, block 810;
- flight type (static test, flight test, commercial flight) and flight number, block 815;
- source identifiers, such as type, P/N (acronym for "Part Number" for part number), which uniquely identifies the equipment, S/N (acronym for "Serial Number" for serial number), which identifies the serial number of the equipment, title and reserved space, block 820;
- supplementary annotations pertaining to the sources, block 825; and
- time interval in UTC (universal time coordinated, where UTC is a compromise between the English "CUT" for "coordinated universal time" and the French "TUC"), for the flight and for each recording, block 830.

This "framework" makes it possible in addition to store the airplane parameters and the parameters specific to each source, for example for the EVS (acronym for "Enhanced Vision System" for advanced vision system): calculated position of the horizon, gain values, activation of de-icing, mode, GPS position (acronym for "Global Positioning System" for global positioning system):
- the descriptions of each parameter are stored in static manner and provided with a UL (acronym for "Universal Label" for universal label), block 835; and
- the samples of parameters are stored dynamically, block 840. These samples contain only the value (without unit) and the GMT time (acquisition time stamp) of each parameter, in order to limit the necessary space. These samples reference the parameter descriptors via a UL to permit retrieval of the parameter name and unit.

This "framework" 805 is designed to satisfy aeronautical applications other than the flight tests, as explained hereinafter.

Figure 9:
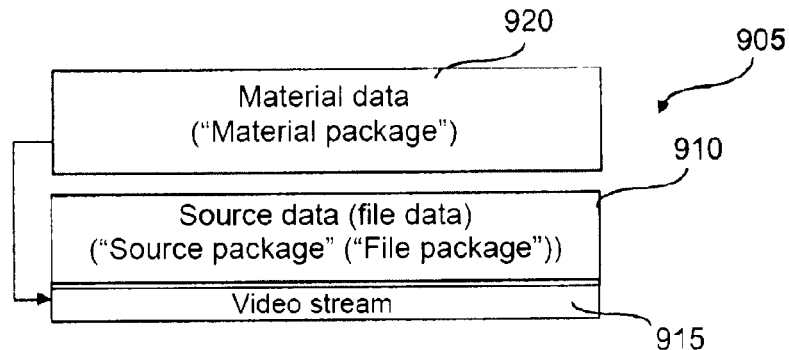

As regards the structure of audio/video files, each audio or video stream is stored in a separate file 905, illustrated in FIG. 9, which file can be used in isolation in a reader or in an assembly software program employing the MXF format.

These files therefore contain only a single "source package" 910, which contains audio or video stream 915 and possibly a discontinuous timecode track (not shown), and a single "material package" 920, which makes it possible to play back this stream in its entirety. Material package 920 has the form demanded at the output, or in other words the form read by a traditional video reader. The elements of this structure are placed and connected to the raw data or "source package" by a "file package" (which can be translated into French as assembly file). This logical representation is very compact: a typical "file package" corresponds to approximately 1 kB, while the essence that it represents may be several megabytes, gigabytes or even terabytes.

The "Op1a" structure is preferred, because it is simple and expanded and makes it possible to ensure good interoperability (the files can be used in almost all readers and assembly software programs employing the MXF format). The "Op0" structure, in the course of standardization, may ultimately be interesting because it will make it possible to optimize the reading functions during recording.

Figure 10:
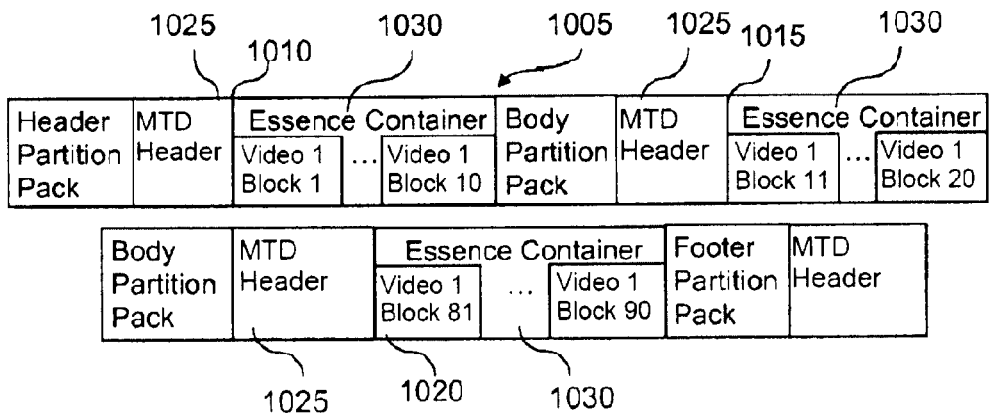
Figure 11:
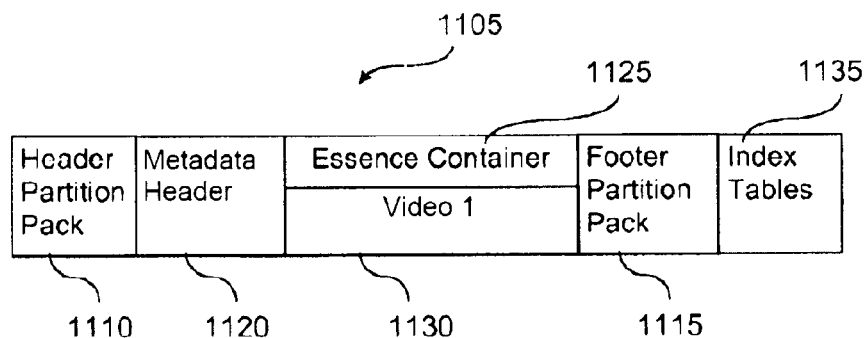

These files may have two different physical structures:
- on board, as illustrated in FIG. 10, files 1005 are acquired in "streaming acquisition" mode, so that they can be used even if they have not been closed correctly. They are divided into several partitions 1010, 1015 and 1020, which correspond to a chosen duration. Thus, in the case of crash, only the streams located in last portion 1020 cannot be easily decoded. Each partition is composed of a metadata tree 1025 and of an essence container 1030. Each metadata tree 1025 contains the structural metadata (which give the logical structure of the file) and the static descriptive metadata (rights, airplane and flight identifier, camera or microphone identifier). Each essence container 1030 wraps the stream in "frame-wrapping" mode over a fixed duration (one image or one GOP), together with data that permit the file to be transmitted correctly (information about the size of the partition, its position in the stream, for example, etc.). On the ground, as illustrated in FIG. 11, the files are converted to "file" mode. The resulting files 1105 contain no more than a header partition 1110 and a footer partition 1115. These partitions contain a metadata tree 1120, which assembles the structural metadata and the static descriptive metadata. A single essence container 1125 is used to wrap the stream (which may be encrypted) by "clip-wrapping" in a single block 1130. An index table 1135 is automatically added to permit fast access to each image according to techniques known in themselves.

As regards the dynamic metadata files, this file containing the airplane parameters or the other data to be associated follows the same logical and physical structures as the files containing the audio/video streams.

Figure 12:
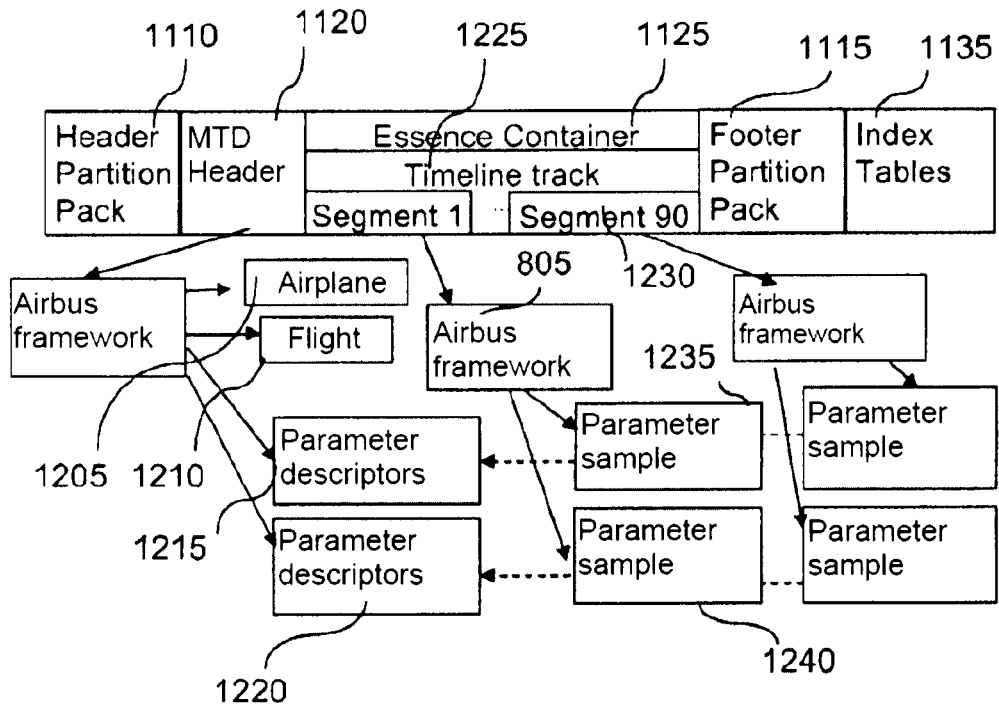

Nevertheless, some differences exist in terms of the metadata and the wrapped streams, which are explained here with reference to FIG. 12. The first difference concerns the static descriptive metadata. The set ("set" in English) of metadata identifying the audio/video source is replaced by an assembly or list of metadata sets 1205 to 1220 describing parameters. Each parameter descriptor set stores the name, the description and the unit of a parameter as well as a UL (Universal Label), or in other words an identifier that is different for each parameter.

The second difference relates to the essence. The audio/video stream is replaced by a dynamic metadata track 1225 of "timeline" type, where timeline is a method, for time-stamping data, that contains the samples of parameters. These are sorted and distributed among segments 1230 of fixed duration (such as 200 ms in the case of 5 pps (acronym for "parameters per second), as a function of their acquisition time stamp (and not as a function of the time stamp of reception by the server), and only a single sample per parameter and per segment is retained. Each sample 1235 is stored in association with a parameter sample metadata set 1240, which stores the value and time stamp of acquisition of the parameter value and references the corresponding parameter descriptor set by means of the UL thereof.

Figure 13:
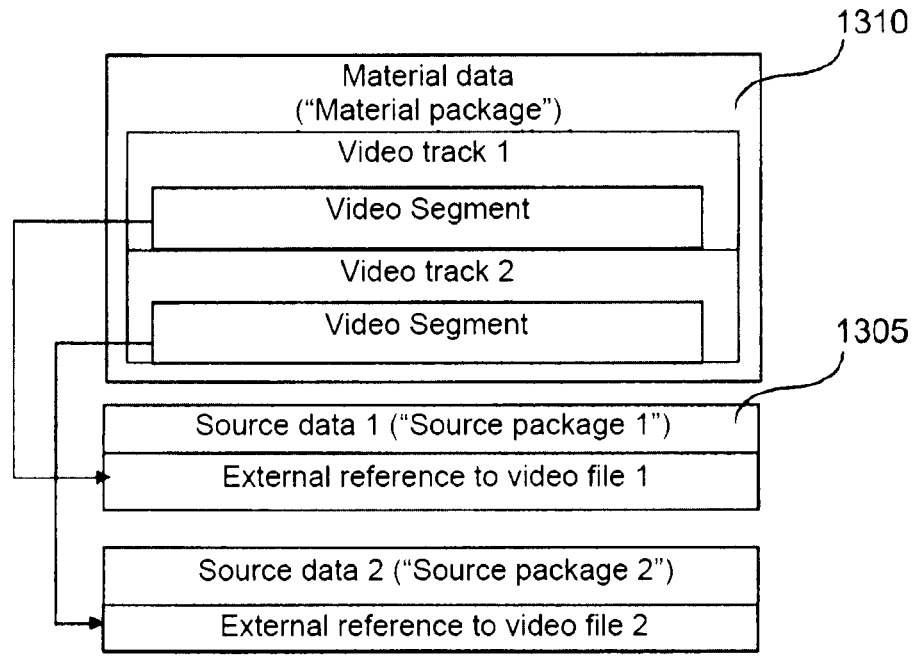
Figure 14:
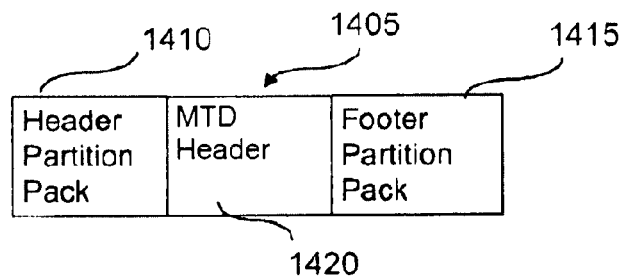

As regards the synthesis file, which references all the other files so that they can be read synchronously, it is composed of several "source packages" 1305, each making reference to a file containing a video, audio or parameter stream, and of a "material package" 1310, with which all these streams can be played back synchronously, as illustrated in FIG. 13. A structure of "Op1b" type makes it possible to manage this complexity. This file is therefore less easily interoperable. On the other hand, the physical structure of this file is simpler, as illustrated in FIG. 14. This file 1405 contains only a "partition header" 1410, a "metadata header" 1420 and a "partition footer" 1415. Header 1410 and footer 1415 contain the structural metadata that give the logical structure of the file, and the static metadata that take up the global static metadata (airplane and flight identifier), and the static metadata associated with each stream (source identifier, parameter list).

From the viewpoint of architecture, several technical choices are possible, such as, for example:

choice of software or hardware compression,
choice of view, and
addition of a module for a playback function.

Figure 15:
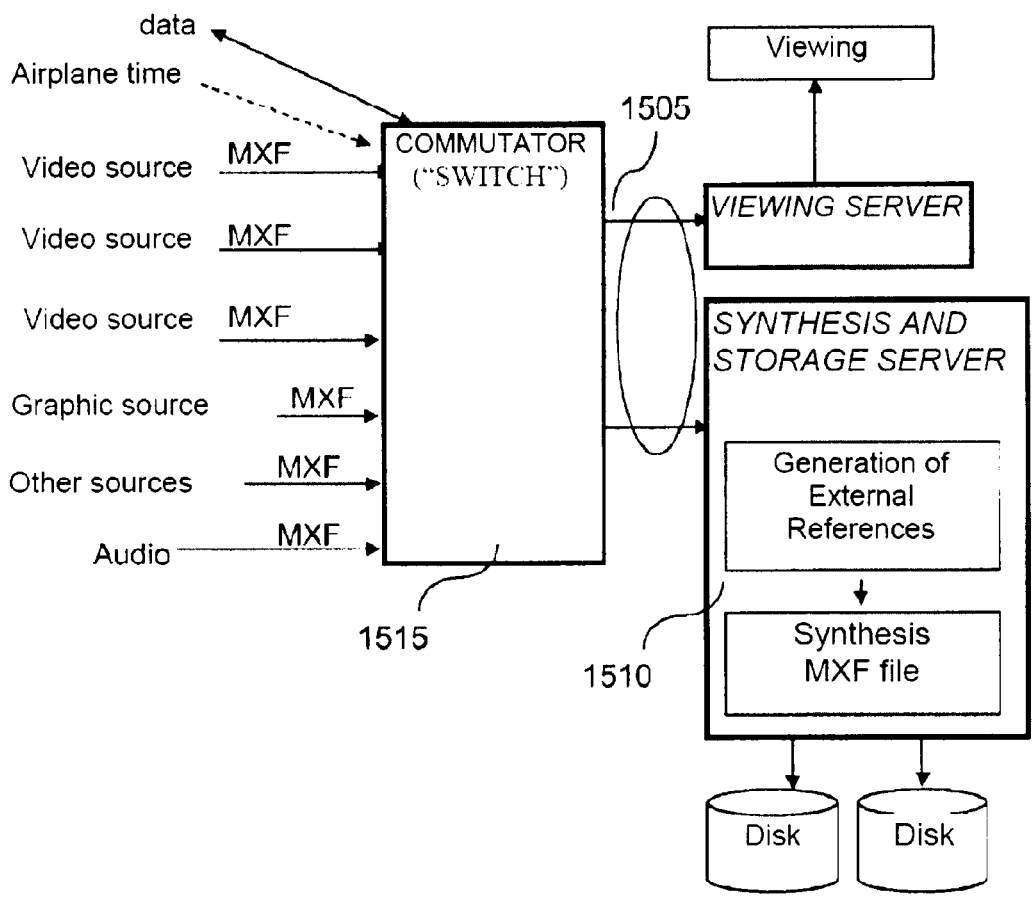
FIGS. 15 and 16 show, in the form of logic diagrams, variants of particular embodiments of the device constituting the object of the present invention.
Figure 16:
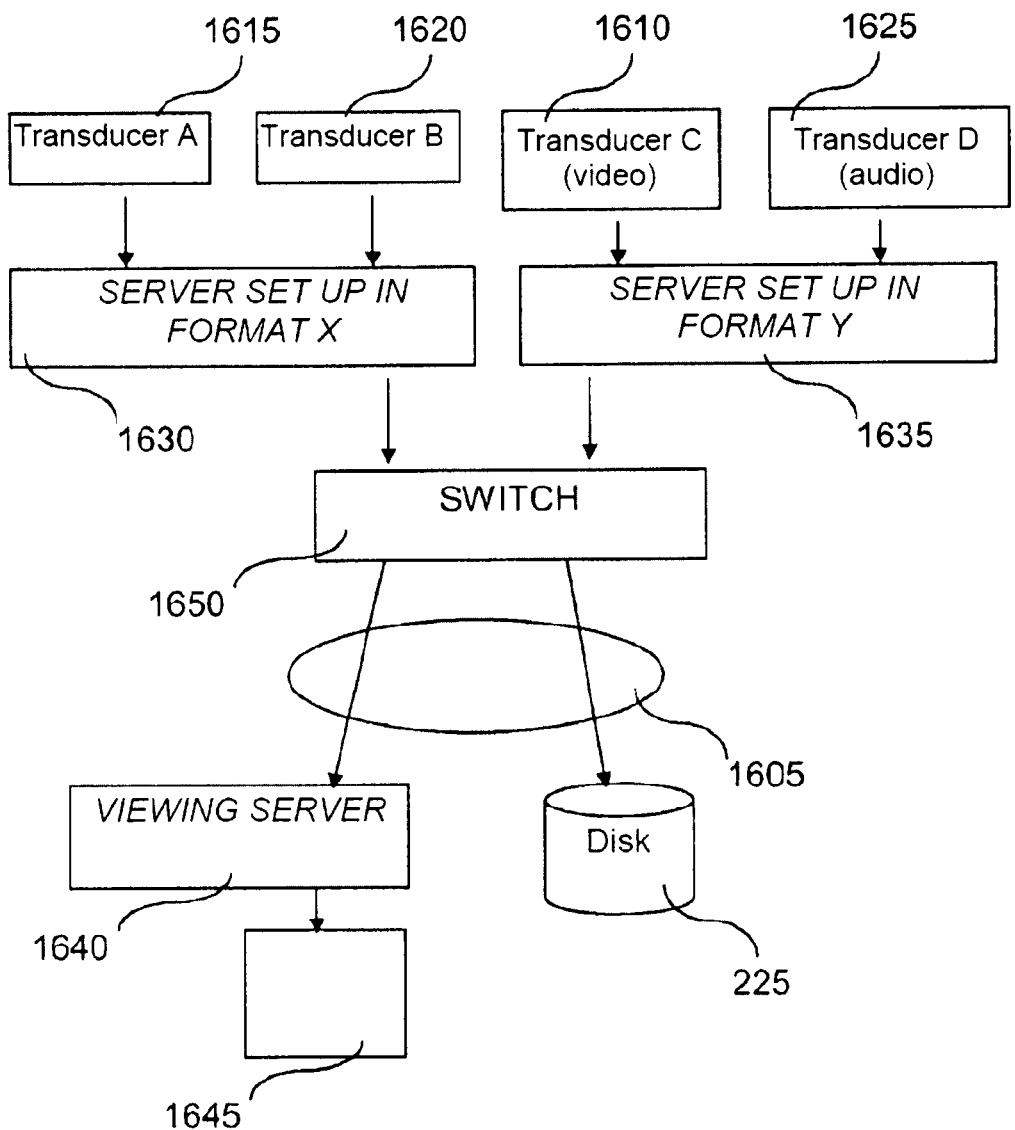

In addition, variants are possible for the global architecture. In a first variant, illustrated in FIG. 15, employing a network 1505 dedicated to video, the transducers furnish data in file format directly to a commutator ("switch" in English) 1515, which implies a certain level of complexity of the transducers. This architecture poses the problem of real time at the viewing level, managed by a server 1510. The desired service and image quality is taken into account for the dimensioning of network 1505. In fact, the speeds generated by the transducers are very great and must be managed without loss.

a) In a second variant, illustrated in FIG. 16, there is employed a global network 1605 not dedicated to video, a network in which video transducers 1610 are on the same level as every other sensor 1615, 1620 or 1625 of the flight test installation. In this case, after capture of data at the transducer level, these data are wrapped with formats adapted to each application, and they travel over the same network by way of servers 1630 and 1635 and of a switch 1650. This architecture also poses the problem of real time at the level of viewing on a view screen 1645 employed by a viewing server 1640. The desired service and image quality is taken into account for the dimensioning of network 1605. In fact, the speeds generated by the transducers are very great and must be managed without loss.

In a third variant, an association of the two preceding variants is established.

The invention claimed is:

1. A device for acquiring and recording data captured in an aircraft, comprising:

a plurality of sources of video data streams to be recorded;
at least one source of time-stamped recording airplane parameter values; and
recording means for recording of data originating from the video data streams and of the airplane parameter values on at least one non-volatile information medium,
wherein the recording means is capable of storing the data of different video data streams associated with the time-stamped recording airplane parameter values in separate files, and
the video data streams originating from data-stream sources are divided into time segments of fixed duration according to a predetermined period of displaying an image frame in a video, the recording means records, for each time segment and each airplane parameter, a most recent value of the airplane parameter available during this time segment.

2. A device according to claim 1, wherein the recording means includes means for generating synthesis files generated in step with the recording of files representative of data originating from different data sources, the synthesis file making it possible to reference and read these files synchronously and including external references, each pointing to the files representative of data originating from data sources.

3. A device according to claim 1, wherein the recording means is capable of recording the airplane parameter values dynamically, in at least one file.

4. A device according to claim 3, wherein the recording means is capable of recording parameter descriptors as well as data relating to a test by virtue of a universal data structure.

5. A device according to claim 1, wherein the recording means is capable of recording each datum of data streams in association with the universal time at which it was acquired.

6. A device according to claim 5, further comprising reading means for generating a synthesis file for at least one transmission of recorded data originating from data streams, the synthesis file making it possible synchronously to reference and read the files containing the data to be transmitted and including the external references, each pointing to files representative of data to be transmitted.

7. A device according to claim 1, further comprising means for routing data originating from sources toward recording means, the recording means including a time-stamping means capable of compensating for transmission delays induced by the routing means.

8. A device according to claim 1, wherein at least one source of parameter values includes means for converting a universal time value to a time code pertaining to a source of stream data.

9. A device according to claim 1, wherein the recording means is capable of time-stamping the data streams at the moment of acquisition by using an internal clock synchronized with an aircraft clock.

10. A device according to claim 1, wherein the recording means includes means for wrapping each data stream originating from a data-stream source in a file that includes static metadata identifying an aircraft, a flight test and the data source, the data of the data stream and information items representative of the instant of capture of the data.

11. A device according to claim 1, wherein the recording means is capable of dividing the recordings into continuous interruption-free and homogeneous sequences without changing configuration, a new directory provided with new files for each new sequence being generated whenever the recording is restarted or reconfigured.

12. A device according to claim 1, wherein the recording means is capable of storing the same data with plural different compression ratios and algorithms.

13. A device according to claim 1, wherein the recording means is capable, during a flight test, of storing the data in a streaming acquisition mode, a recording mode in which the file is divided into plural partitions containing the data of at least one data stream followed by an information block that makes it possible to read the data of a data stream.

14. A device according to claim 1, further comprising indexing means for generating an index table that indicates where the different recorded images are located.

15. A device according to claim 1, wherein the recording means is capable of preserving at least one data stream in its raw form, without compression.

16. A device according to claim 1, wherein the recording means is capable of defining descriptive metadata, which make it possible to embellish each file with information items intended for the user, organized in a framework form.

17. A device according to claim 1, wherein the recording means is capable of recording static descriptive metadata files provided with lists of sets of metadata describing parameter values.

18. A device according to claim 1, wherein the recording means is capable of furnishing recorded data in a form of playback of one or more synchronized data streams.

19. A method for acquiring and recording data captured in an aircraft including a plurality of sources of video data streams to be recorded, at least one source of time-stamped recording airplane parameter values, and means for recording data originating from video data streams and from airplane parameter values on at least one non-volatile information medium, the method comprising:

storing the data of different video data streams in separate files; and associating, in each file, the recorded data with the time-stamped recording airplane parameter values, wherein the video data streams originating from data-stream sources are divided into time segments of fixed duration according to a predetermined period of displaying an image frame in a video, and the recording means recording, for each time segment and each airplane parameter, a most recent value of the airplane parameter available during this time segment.

20. A device for acquiring and recording data captured in an aircraft, comprising:

a plurality of sources of video data streams to be recorded;

at least one source of time-stamped recording airplane parameter values; and a recorder that records data originating from the video data streams and the airplane parameter values on at least one non-volatile information medium, wherein the recorder is configured to store the data of different video data streams associated with the time-stamped recording airplane parameter values in separate files, and the video data streams originating from data-stream sources are divided into time segments of fixed duration according to a predetermined period of displaying an image frame in a video, and the recorder records, for each time segment and each airplane parameter, a most recent value of the airplane parameter available during this time segment.

* * * * *